United States Patent [19]
Tatsumi et al.

[11] Patent Number: 5,453,306
[45] Date of Patent: Sep. 26, 1995

[54] PROCESS FOR DEPOSITING OXIDE FILM ON METALLIC SUBSTRATE BY HEAT PLASMA FLASH EVAPORATION METHOD

[75] Inventors: Noriyuki Tatsumi; Jiro Tsujino; Atsushi Kume; Yuh Shiohara; Shoji Tanaka, all of Tokyo; Shigenori Yuhya, Hyogo; Kei Kikuchi, Kanagawa, all of Japan

[73] Assignees: International Superconductivity Technology Center, Tokyo; Hokkaido Electric Power Co., Inc., Hokkaido; Fujikura Ltd., Tokyo; Tokyo Gas Co., Ltd., Tokyo; Hitachi Cable, Ltd., Tokyo, all of Japan

[21] Appl. No.: 269,178

[22] Filed: Jun. 30, 1994

[30] Foreign Application Priority Data

Jun. 30, 1993 [JP] Japan .................................. 5-162465

[51] Int. Cl.$^6$ ...................................................... B05D 3/06
[52] U.S. Cl. ........................... 427/569; 427/62; 427/118; 427/255.7; 427/318; 427/419.2; 427/585; 505/325; 505/477; 505/480; 505/500; 505/741; 505/819
[58] Field of Search ...................... 427/535, 557, 427/573, 372.2, 419.2, 569, 585, 62, 118, 255.7, 318; 505/325, 477, 480, 500, 741, 819

OTHER PUBLICATIONS

Kumar et al. "Synthesis of Superconducting $YBa_2Cu_3O_7$—Thin Films on Nickel Based Superalloy Using In Situ Pulsed Laser Deposition" *Appl. Phys. Lett.* vol. 52, No. 24, (Dec. 1990).

Kumar et al. "Enhancement in Critical Current Density of $YBa_2Cu_3O_7$—Thin Films on Hastelloy With Tin Buffer Layers" *Appl. Phys. Lett.* vol. 61, No. 8 (Aug. 1992).

Y. Iijima et al. "In-Plane Aligned $YBa_2Cu_3O_{7-x}$ Thin Films Deposited on Polycrystalline Metallic Substrates" *Appl. Phys. Lett.* vol. 60, No. 6 (Feb. 1992).

N. Tatsumi et al. "Synthesis of Superconducting Oxide Film on Metal Substrate by Radio Frequency Plasma Flash Evaporation" (no date).

Y. Iijima et al. "Biaxially Aligned YSZ Buffer Layer on Polycrystalline Substrates" *Proceedings of ISS '91* (no month available).

Y. Watanabe "Growth of InAs on $EuBa_2Cu_3O_{7-y}$ Superconducting Thin Films with $SrF2$ Interlayers" *Appl. Phys. Lett.* vol. 8, No. 24 (Aug. 1992).

*Primary Examiner*—Bernard Pianalto
*Attorney, Agent, or Firm*—Helfgott & Karas

[57] ABSTRACT

The generation of a reaction product is suppressed between a metallic substrate and plasma in depositing a ceramic intermediate layer on the metallic substrate in a process for depositing an oxide film on the metallic substrate by thermal plasma flash evaporation method. Thus, there is no reaction phase in the ceramic intermediate layer and the metallic substrate, and an intermediated buffer layer of only oxide ceramic is deposited on a flat surface of the metallic substrate. The intermediate ceramic layer is deposited in inert atmosphere of a low oxygen concentration at a temperature of less than 600° C. for the metallic substrate. Then, a superconducting thin film is deposited on the ceramic intermediate layer.

5 Claims, 4 Drawing Sheets

PROCESS FOR DEPOSITING OXIDE FILM ON METALLIC SUBSTRATE BY HEAT PLASMA FLASH EVAPORATION METHOD

FIELD OF THE INVENTION

The invention relates to a process for depositing an oxide film on a metallic substrate by thermal plasma flash evaporation method in which a film of a large-area is deposited at a fast deposition rate and it can be applied for making a wire, a magnetic shield, a current-lead and the like.

BACKGROUND OF THE INVENTION

Many researches have been made in respect to high-temperature superconducting materials which can function at the temperature of liquid nitrogen of 77 K., and there have been provided reports on the characteristics of the resulting superconducting films. It is well known that a high-quality oxide superconducting film can be obtained when the oxide superconducting thin film of $YBa_2Cu_3O_{7-x}$ and the like is formed on the singlecrystalline substrate of $SrTiO_3$ and the like.

On the contrary, it is known that the oxide superconducting film which has relatively low current-transport properties of critical current density(Jc) of $10^3$ to $10^4$ $A/cm^2$ tends to be obtained due to the difference of the orientation when the oxide superconducting film is directly formed on the polycrystalline substrate of silver, Ni-based alloy, YSZ(Yttrium Stabilized Zirconia), $Al_2O_3$ and the like.

Therefore, it has been tried to deposit an intermediate buffer layer for preventing mutual diffusion between an oxide superconductor and a substrate, particularly a metallic substrate so as to get high current-transport properties. Ag, YSZ, MgO, YSZ-Pt, YSZ-Ag, $BaTiO_3$, TiN and the like are used as this intermediate buffer layer. On the other hand, there are used coating method, laser ablation (LPVD) method, CVD method, ion-beam sputtering method and the like as the conventional technique for depositing a thin film on a substrate.

On pages 2594 to 2596 of "Applied Physics Letters, vol. 57, No. 24 (Dec. 10, 1990)", it is reported that Ashok Kumar et al. for North Carolina state university grow YSZ at the film deposition temperature of 650° C. on the hastelloy metallic substrate which is Ni-based alloy by means of laser physical vapor deposition(LPVD) method in which excimer laser is employed, deposite $YBa_2Cu_3O_{7-x}$(hereinafter referred to Y-system superconductor) film, and obtain a high-temperature superconducting thin film of critical current density(Jc) of 7000 $A/cm^2$(77 K., 0T). Further, on pages 976 to 978 in "Applied Physics Letters, vol. 61, No. 8 (Aug. 24, 1992)", Ashok Kumar et al. report that titanium nitride-(TiN) is employed as the intermediate buffer layer to form an oxide superconducting thin film where Y-system superconductor is formed on the hastelloy metallic substrate with the intermediate layer, whereby critical current density of around $9.0\times10^4$ $A/cm^2$(77 K.,0T) is obtained. Here, the process for depositing the intermediate layer comprises the step of radiating KrF excimer laser to TiN target by the PVD method mentioned above where the metallic substrate temperature of 600° C. and the pressure less than $10^{-6}$ Torr are employed.

On page 769 to 771 in "Applied Physics Letters, vol. 60, No. 6 (Feb. 10, 1992)", Iijima, an employee of K. K. Fujikura who is one of the applicants of this application, and others report that they make an oxide superconducting thin film which is formed with hastelloy metallic substrate/YSZ intermediate layer/Y-system superconductor, wherein critical current density(Jc) is $2.5\times10^5$ $A/cm^2$(77 K.,0T) at maximum. The process for depositing an intermediate layer used herein is called ion-beam assisted deposition(IBAD) method, wherein it comprises sputtering YSZ target by Ar ion-beam at the pressure less than $3.0\times10^{-4}$ Torr, and radiating Ar and O ion-beam (ion-beam bombardment) to a substrate during film deposition. At this time, the film deposition temperature reaches near 100° C. by ion-beam radiation.

By the above process for depositing the oxide superconducting thin film on the substrate on which the intermediate buffer layer is formed, the oxide superconducting thin film with relatively high current-transport properties is obtained, however, there are disadvantages in that it takes a long time and it is impossible to manufacture long or large area products like a wire and a magnetic shield material at one step. On the other hand, it is desired to deposit a high-temperature superconducting thin film having higher quality and higher current-transport properties for use as wires, cables, tapes, magnetic shield, current leads and the like. Accordingly, it is required to improve the quality of an intermediate buffer layer on the metallic substrate, wherein the intermediate buffer layer becomes the base material for depositing the oxide superconducting thin film thereon.

Meanwhile, there is thermal plasma flash plasma evaporation method as one of methods for depositing an oxide film on a substrate. The thermal plasma flash plasma evaporation method is comprised of depositing an oxide film on the substrate with high-frequency plasma of a superhigh temperature. When this method is applied to the film deposition of an intermediate buffer layer and an oxide superconducting thin film, it can be expected that the film deposition with high rate on a and large area in comparison with another method of film deposition is performed. However, since the deposition by the high-frequency plasma which is suitable for a ceramic substrate which is stable at a high temperature requires superhigh-temperature plasma gas, there is a disadvantage in that a reaction product between plasma and a metallic substrate tends to be formed on the metallic substrate, when the metallic substrate is easier to react with plasma in comparison with the a ceramic substrate.

SUMMARY OF THE INVENTION

Accordingly, it is an object of the invention to provide a process for depositing an oxide film on a metallic substrate by thermal plasma flash evaporation method in which an oxide superconductor having improved current transport properties are obtained.

It is another object of the invention to provide a process for depositing an oxide film on a metallic substrate by thermal plasma flash evaporation method in which an oxide superconductor of crystal grains having improved bonding properties is obtained.

It is a further object of the invention to provide a process for depositing an oxide film on a metallic substrate by heat plasma flash evaporation method in which the generation of a reaction product is suppressed between plasma and the metallic substrate in depositing a ceramic intermediate layer on the metallic substrate.

It is a still further object of the invention to provide a process for depositing an oxide film on a metallic substrate by heat plasma flash evaporation method in which no reaction phase is produced in the metallic substrate and a ceramic intermediate layer.

It is a yet still further object of the invention to provide a process for depositing an oxide film on a metallic substrate by thermal plasma flash evaporation method in which an intermediated buffer layer of only oxide ceramic is formed on a flat surface of the metallic substrate.

According to the invention, a process for depositing an oxide film on a metallic substrate by thermal plasma flash evaporation method, comprises the steps of:

providing the metallic substrate on the holder;

depositing a ceramic intermediate layer on the metallic substrate; and depositing an oxide superconducting layer on the ceramic intermediate layer;

wherein the step of depositing the ceramic intermediate layer is performed in inert atmosphere of a low oxygen concentration, while the metallic substrate is maintained to be less than 600° C.

In the invention, the inert atmosphere is preferably made by supplying argon of a low oxygen concentration into the chamber, and the said low oxygen concentration in the inert atmosphere is preferably less than 10 vol. %. Further, the deposition of the ceramic intermediate layer by the heat plasma flash evaporation method is preferably performed while increasing the substrate temperature in the range of less than 600° C., and the increase of temperature preferably starts at 350° C.

In accordance with the process for depositing an oxide film on a metallic substrate by heat plasma flash evaporation method in the present invention, the low oxygen concentration during the deposition of the ceramic intermediate layer and the temperature control of the metallic substrate suppress the generation of a reaction product between plasma and the metallic substrate. Therefore, the resulting metallic substrate deposited with the ceramic intermediate layer contains substantially no reaction phase, so that it is possible to obtain the oxide superconducting film which has good current-transport properties and good bonding among the crystalline particles, since the component of the metallic substrate and the reaction product do not diffuse into, for example, a film of a Y-system superconductor such as $YBa_2Cu_3O_{7-x}$ which is deposited by the thermal plasma flash evaporation method.

BRIEF DESCRIPTION OF THE DRAWINGS

The invention will be described in detail in accordance with the following drawings wherein.

DESCRIPTION OF THE PREFERRED EMBODIMENT

A process for depositing an oxide film on a metallic substrate by thermal plasma flash evaporation method in a preferred embodiment according to the present invention will be described with referring to the attached drawings.

Figure 1:
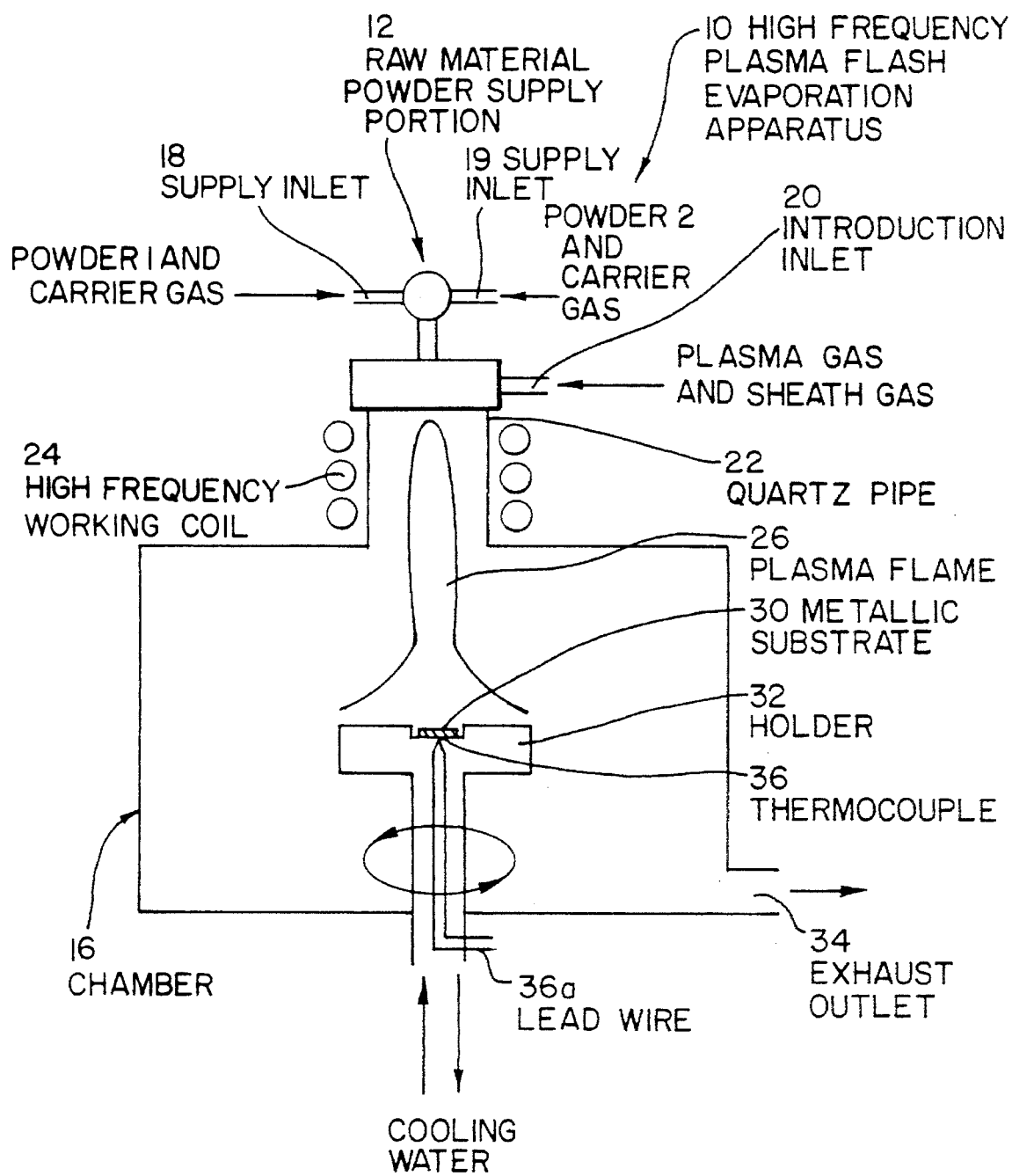
FIG. 1 is an explanatory cross-sectional view showing a high-frequency plasma flash evaporation apparatus for performing a process for depositing an oxide film on a metallic substrate by thermal plasma evaporation method according to the invention.

In FIG. 1, there is shown a high-frequency plasma flashing evaporation apparatus which is used for carrying out the process for depositing an oxide film on a metallic substrate by thermal plasma flash evaporation method in the present invention. In the following description, the apparatus shown in FIG. 1 is illustratively used for describing a process for depositing an oxide film on a metallic substrate by thermal plasma flashing evaporation method in the present invention, but the application of the present invention is not limited to the apparatus. As shown in FIG. 1, the high-frequency plasma flashing evaporation apparatus (hereinafter referred to "plasma apparatus") 10 is comprised of a raw material supplying portion 12, and a chamber 16.

The raw material powder supplying portion 12 is provided with two supply inlets 18 and 19, wherein two different kinds of powders, for instance, powder 1 and powder 2 with carrier gases can be separately or simultaneously supplied by changing over these inlets 18 and 19. If the two supply inlets 18 and 19 are simultaneously opened, the raw material powders can be simultaneously supplied from both inlets 18 and 19. Of course, the raw material powders which are supplied via these two supply inlets 18 and 19 may be different or the same. Instead, only a raw material may be supplied from one inlet, and only a carrier gas may be supplied from the other inlet. By doing so, it is possible to adjust the time and the amount of supply of the raw material powder. Here, the raw material powder is ceramic powder which forms the intermediate buffer layer or the powder mixture including a component thereof, or oxide superconductor powder which forms the oxide superconducting thin film or the powder mixture including a component thereof.

The plasma generating portion 14 which forms a plasma torch comprises an introduction inlet 20 for plasma actuating gas which is comprised of plasma gas and sheath gas, a quartz pipe 22 and a high-frequency operating coil 24 which is coiled on the circumference of the quartz pipe 22 and is supplied with a high-frequency current. When the plasma actuating gas is introduced from the introduction inlet 20 into the quartz pipe 22, and the high-frequency current is supplied to the operating coil 24, the plasma actuating gas is ionized, and plasma flame 26 is generated. On the other hand, when the carrier gas and the raw material powder which are introduced into the raw material powder supply portion 12 are mixed with the plasma actuating gas at the center of the plasma generating portion 14, and introduced into the quartz pipe 22, they are similarly ionized by the high-frequency electric power applied to the operating coil 24 to produce superhigh-temperature plasma flame 26. The plasma flame 26 extends over the holder 32.

The holder 32 for placing the substrate 30 is provided with a thermocouple 36 and lead wires 36a, by which the temperature of the metallic substrate 30 placed thereon is monitored and is driven by a rotation driving apparatus, as shown by a circular arrow, wherein the holder 32 is cooled by water as shown by solid line arrows.

The raw material powder which is heated up to a superhigh temperature in the plasma flame 26 is deposited as an oxide film on the metallic substrate 30 just under the point of the flame 26 to form a ceramic intermediate layer. The oxide film is uniformly deposited, since the holder 32 slowly rotates. The temperature of the metallic substrate 30 is monitored by the thermocouple 36, whereby the flow of the plasma actuating gas and the cooling water is controlled to adjust the temperature of the metallic substrate 30.

The plasma apparatus used in the present invention is basically designed as mentioned above.

Figure 2:
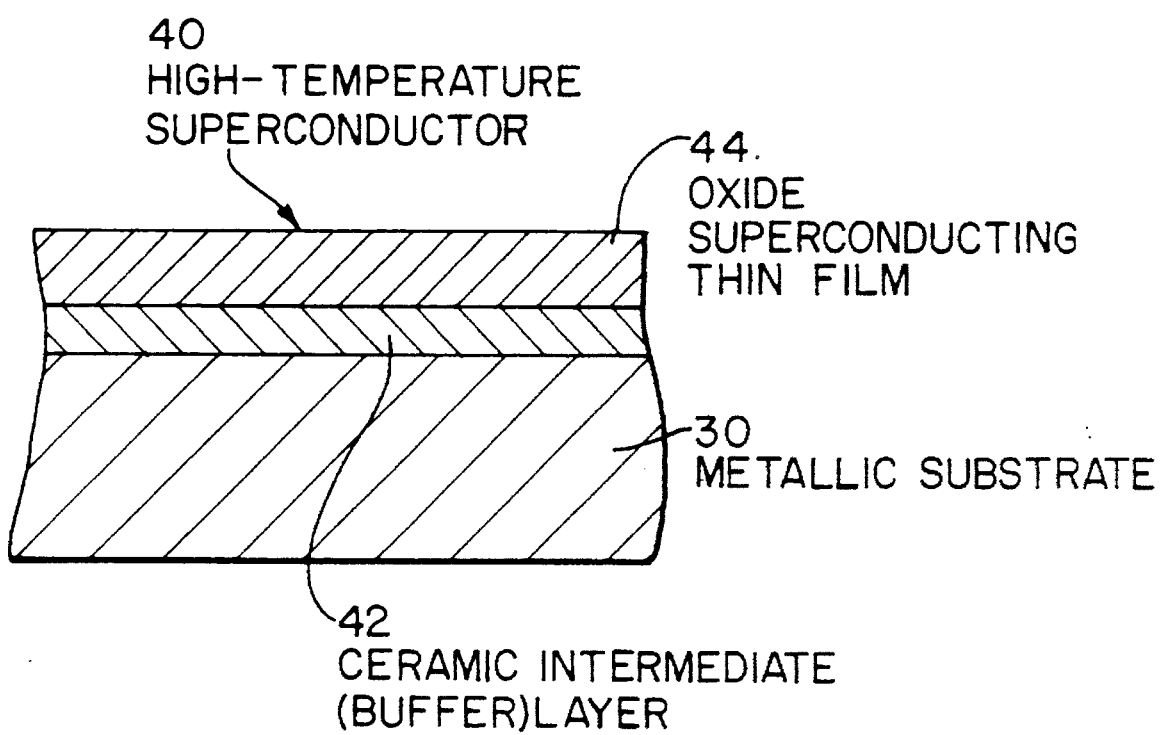
FIG. 2 is a cross-sectional view illustrating a high-temperature superconductor which is formed in the invention.

In FIG. 2, shown is a high-temperature superconducting thin film 44 which is finally obtained by the process for depositing an oxide film by the thermal plasma flash evaporation method in the invention. The high-temperature superconducting thin film 40 is formed on a ceramic intermediate buffer layer 42 functioning as a mutual-diffusion preventing film on the metallic substrate 30.

The metallic substrate 30 used in the invention is not particularly limited in material, and may be a singlecrystalline or polycrystalline metallic substrate. Furthermore, the metal for the substrate is not particularly limited. For instance, nickel-based alloy such as hastelloy, SUS (stainless steel), silver and the like may be typically employed.

In accordance with the invention, the ceramic intermediate buffer layer 42 is formed on the metallic substrate 30 and functions as a diffusion preventing film for preventing mutual diffusion between the oxide superconductor and the component of the metallic substrate. Here, the ceramic material for forming the ceramic intermediate buffer layer 42 is not specifically limited, and, for instance, YSZ, YSZ-Pt, YSZ-Ag, $Al_2O_3$, MgO, TiN and the like may be typically employed. Therefore, the raw material powder which is supplied to the raw material powder supply portion 12 of the plasma generating apparatus 10 shown in FIG. 1 may be ceramic powders as mentioned above or mixed powders to form the ceramic intermediate buffer layer 42 in which the components forming the ceramic material are mixed except for oxygen by a predetermined composition ratio. Furthermore, the composition ratio of $ZrO_2$ and $Y_2O_3$ in YSZ is not specifically limited, and the composition ratio which is known in the art may also be employed.

Though the oxide superconducting thin film 44 is formed on the ceramic intermediate buffer layer 42, the oxide superconductor is not specifically limited in material, and various oxide superconducting materials may be employed. As an oxide superconducting material used in the invention, for instance, $YBa_2Cu_3O_{7-x}$ and $YBa_2Cu_4O_{8-x}$ may be typically employed. The raw material powder which is supplied to the raw material powder supply portion 12 when the oxide superconducting thin film 44 is deposited by the plasma generating apparatus 10 shown in FIG. 1, may be superconductive powder or a mixed powder in which the components forming the superconducting material are mixed except for oxygen by a predetermined composition ratio.

The dimension and the thickness of the ceramic intermediate buffer layer 42 and the oxide superconducting thin film 44 are not specifically limited, and may be selected dependent on the size of the metallic substrate 30. The condition of film deposition in the step of forming the ceramic intermediate buffer layer 42 which is a future in the invention will be described below.

The atmosphere inside the chamber 16 must be inert with a low oxygen concentration when the ceramic intermediate buffer layer 42 is formed. Here, the inert atmosphere is not specifically limited. For instance, Ar and He may be typically employed. Therefore, both the carrier gas which is used for introducing the ceramic powder mentioned above from the supply portion 12 of the plasma apparatus 10 to form the intermediate layer 42 and the plasma actuating gas which is introduced from the introduction inlet 20 of the plasma generating portion 14 must be inert. Here, the pressure inside the chamber 16 is not limited if it is reduced, and the pressure of 150 to 250 Torr is preferable.

On the other hand, the amount of oxygen which is mixed with the plasma actuating gas to generate the plasma flame is needed to be controlled at a low concentration inside the chamber 16, preferably less than 10 vol. %. If the oxygen concentration in the inert atmosphere inside the chamber 28 exceeds 10 vol. %, the oxidation on the metallic substrate may undesirably occur to be observed by X-ray diffraction.

Though the minimum concentration of oxygen is not specifically limited, the concentration of oxygen is decreased to an extent that the plasma flame 26 is controlled to be a size necessary for the film deposition in the ceramic intermediate layer 42. However, the oxygen free inert gas such as pure argon harms the film deposition since the plasma flame 26 becomes too small.

The temperature of the metallic substrate 30 at the time of the film deposition of the ceramic intermediate layer 42 is needed to be maintained less than 600° C. The reason is that, if the temperature of the metallic substrate exceeds 600° C., the reaction product between the metallic substrate 30 and plasma, (a ceramic component or oxygen) is produced, so that the reaction phase exists in the metallic substrate 30 and/or the ceramic intermediate layer 42. The existence of the reaction product can be observed by the X-ray diffraction. When the reaction phase exists, it is impossible to obtain a good high-temperature superconductor, since the component of the metallic substrate 30 diffuses into or reacts with the oxide superconducting thin film 44 in the subsequent film deposition of the Y-system superconducting thin film 44. Furthermore, in case that the reaction phase is an oxide scale to be produced on the surface of the metallic substrate 30, the surface of the metallic substrate 30 becomes uneven, and it is impossible to obtain an oxide superconducting thin film which has good current-transport properties and good bonding between crystalline particles.

Here, the temperature in the film deposition is preferably gradually increased in the range of less than 600° C. The beginning of the increase in temperature is preferably at 350° C. for the metallic substrate. The rate of the increase in temperature is preferably 5° to 15° C./min. The reason why these conditions are employed is that, when the control in the predetermined range of temperature and the increase rate is given, even if the ceramic intermediate layer 42 is deposited on the metallic substrate 30 which tends to be oxidized by high-temperature thermal plasma, the production of the reaction phase between the metallic substrate and plasma can be prevented. The minimum temperature for the metallic substrate 30 is not specifically limited, since the heating of the plasma flame 26 is not avoided. However, the above staring temperature of 350° C. may be used as a minimum temperature, since the crystal growth generally becomes insufficient and the adherence of the crystal to the substrate becomes deteriorated, if the temperature is not above a certain level.

Though the frequency of a high frequency power which is applied to the high-frequency operating coil 24 is not specifically limited, it may be selected in accordance with the area and the thickness of the metallic substrate 30 or the area and the thickness of the ceramic intermediate layer 42 deposited.

The deposition of the oxide superconducting thin film 44 is performed as follows. After the ceramic intermediate layer 42 is formed in the plasma apparatus 10 shown in FIG. 1 in accordance with the thermal plasma evaporation method, it is similarly performed in the same plasma apparatus 10 by using the raw material for depositing the oxide superconducting film substituting the plasma actuating gas for high oxygen-concentration gas to provide oxidation atmosphere inside the chamber 16, and providing the film deposition condition suitable for forming the oxide superconducting film therein. The deposition condition of the superconducting thin film 44 is not specifically limited, and a conventionally known condition may be used. For instance, an oxygen concentration of 70 to 96 vol % corresponding to an inert gas concentration of 4 to 30 vol % for the oxidation atmosphere, a pressure of 150 to 250 Torr, and a metallic substrate temperature of 550° to 650° C. may be used in the deposition of the oxide superconducting thin film. Meanwhile, the inventors of the present invention have succeeded in obtaining a high-temperature superconductor which is deposited with $YBa_2Cu_3O_{7-x}$ on the MgO substrate by use of the thermal plasma evaporation method and have found that the critical current density(Jc) is $6.8 \times 10^5$ A/cm2(77K, 0 T) as described on page 2673 of in "J. Mater. Res. 7 (1992)".

An example of the present invention will be described below in detail.

EXAMPLE

Table 1 shows the deposition condition, by which the film deposition is performed in the plasma apparatus shown in FIG. 1.

YSZ is deposited on a hastelloy metallic substrate and a Y-system superconducting thin film is then deposited by changing the temperature condition of the metallic substrate.

TABLE 1

| | |
|---|---|
| Metallic Substrate | Mirror Surface-Finished Hastelloy (C276: 15 wt. % Cr-16 wt. % Mo—Ni) |
| YSZ powder | $ZrO_2$-2 mol % $Y_2O_3$ |
| Y-system Super-conductor Powder | $Y_{1.3}Ba_{2.2}Cu_{3.2}O_{1-x}$ |
| High-Frequency Electric Power | 45 KW (in the deposition of YSZ film) |
| Plasma-Actuating Electric Power | 44 KW (in the deposition of Y-system superconductor film) |
| Pressure | 200 Torr |
| Carrier Gas | Ar, 10 l/min. |
| Plasma Actuating Gas | Ar, 47 l/min.; $O_2$, 5 l/min. (in the deposition of YSZ film) |
| Plasma Actuating Gas | Ar, 2 l//min; $O_2$, 50 l/min. (in the deposition of Y-system superconductor film) |

Figure 3:
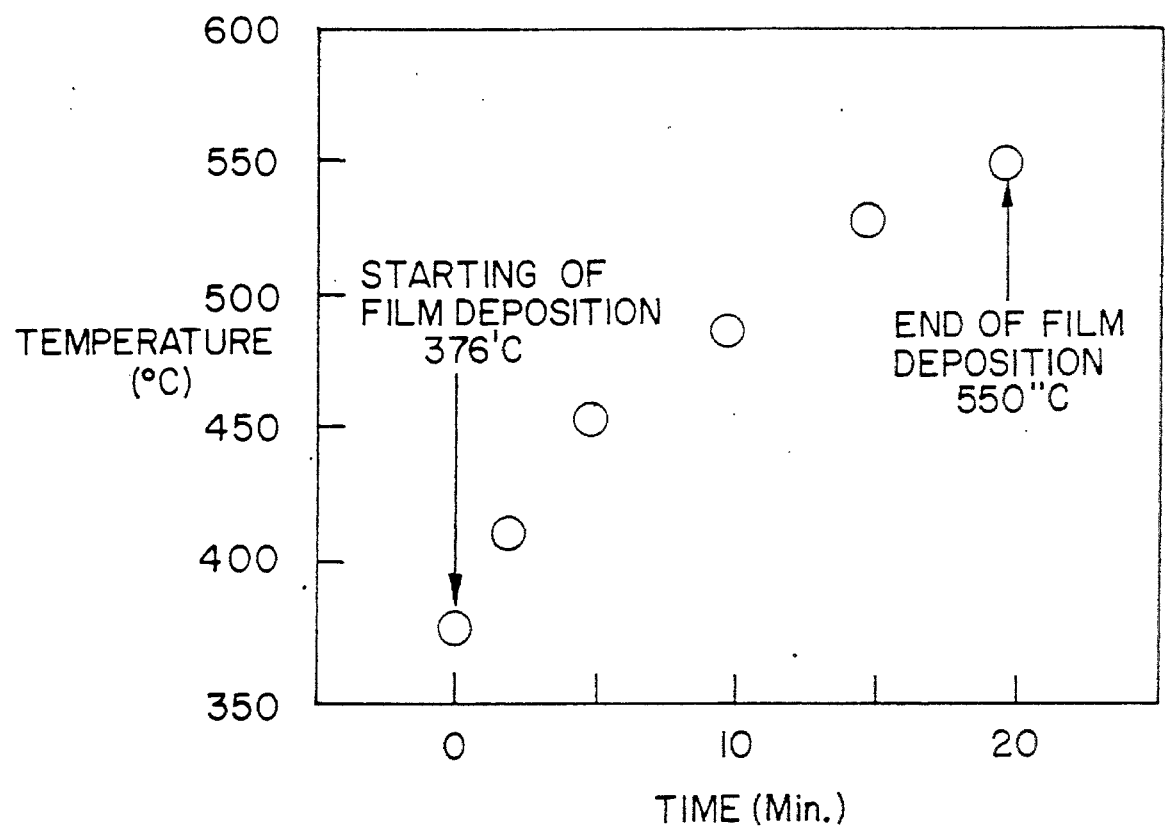
FIG. 3 is a graph showing a temperature in an example in the invention.
Figure 4:
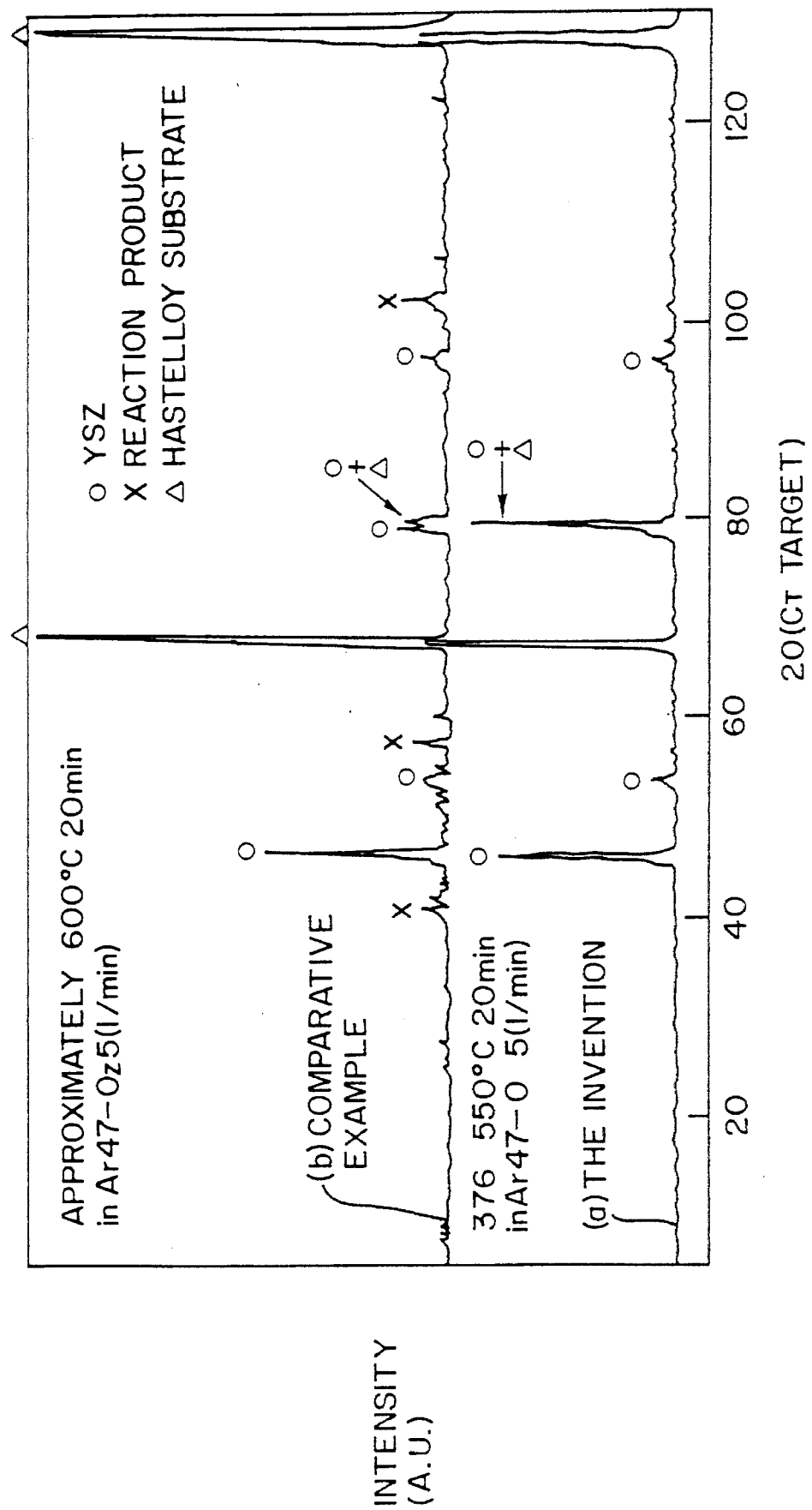
FIG. 4 is an X-ray diffraction chart of samples obtained in an example in the invention and a comparative example.

In FIG. 3, there is shown an example of the temperature condition of the metallic substrate in the invention when YSZ is deposited on the hastelloy metallic substrate. In FIG. 4, there is shown an X-ray diffraction chart of YSZ in the invention which is deposited on a hastelloy metallic substrate dependent on the temperature condition shown in FIG. 3, and YSZ in a comparative example which is deposited approximately at 600° C. In the example of the present invention in which YSZ is deposited on the hastelloy substrate in accordance with the staring temperature of the film deposition of 376° C. (temperature of the substrate), and the end temperature of the film deposition of 550° C. (temperature of the substrate) for the time of the film deposition 20 min. as shown in FIG. 3, the X-ray diffraction chart as shown in FIG. 4(a) is obtained. In the comparative example in which the heating of the hastelloy substrate by heat plasma is done up to about 600° C., and at the temperature, a YSZ film is deposited(evaporated) on the hastelloy substrate for 20 min., the X-ray diffraction chart as shown in FIG. 4(b) is obtained.

In FIG. 4(a) showing the example of the present invention, a peak in the X-ray diffraction caused by the reaction product between the hastelloy substrate component and the plasma(YSZ component) is not found, and only peaks of the hastelloy substrate and YSZ in the X-ray diffraction is found. Therefore, it is proved that no reaction product is produced, and only YSZ is formed. On the other hand, in FIG. 4(b) showing the comparative example, the reaction product peaks in the X-ray diffraction in addition to the peaks of the hastelloy substrate and YSZ in the X-ray diffraction are found. Therefore, it is proved that the reaction product is produced at the same time when YSZ is formed.

Though results are not shown in FIGS. 3 and 4, a peak of YSZ is not substantially found in a sample in which a hastelloy substrate is heated to be 300° C., and deposition time is 10 min. by the X-ray diffraction analysis. This proves that the formation of YSZ is insufficient.

In the invention, since a ceramic intermediate layer is deposited as a diffusion preventing layer on a metallic substrate by thermal plasma flash evaporation method, before an oxide superconducting thin film is deposited on the metallic substrate by thermal plasma flash evaporation method, the generation of a reaction product between the metallic substrate and plasma is prevented, whereby only the ceramic intermediate layer not including the reaction product can be deposited on the flat surface of the metallic substrate.

Accordingly, when the oxide superconducting thin film is deposited on the metallic substrate via the ceramic intermediate layer not resulting in the generation of the reaction product, the oxide superconductor which has good current-transport properties and good bonding among crystalline particles can be deposited. Furthermore, by using thermal plasma flash evaporation method in the invention, both the ceramic intermediate layer and the oxide superconducting thin film can be formed on the metallic substrate at high speed and on a large area, so that it can be applied to the fabrication of a long wire, a magnetic shield, a current-lead and the like.

Although the invention has been described with respect to specific embodiments for complete and clear disclosure, the appended claims are not to be thus limited but are to be construed as embodying all modification and alternative construction that may occur to one skilled in the art which fairly fall within the basic teaching herein set forth.

What is claimed is:

1. A process for depositing an oxide film on a metallic substrate by thermal plasma flash evaporation comprising the steps of:

providing said metallic substrate on a holder;

depositing a ceramic intermediate layer on said metallic substrate by thermal plasma flash evaporation; and depositing an oxide superconducting layer on said ceramic intermediate layer by thermal plasma flash evaporation;

wherein the step of depositing said ceramic intermediate layer is performed in inert atmosphere of a low oxygen concentration, while said metallic substrate is maintained to be less than 600° C.

2. A process for depositing an oxide film on a metallic substrate by thermal plasma flash evaporation method, according to claim 1, wherein said inert atmosphere is provided by supplying argon of said low oxygen concentration into a deposition chamber.

3. A process for depositing an oxide film on a metallic substrate by thermal plasma flash evaporation method, according to claim 2, wherein said low oxygen concentration in said inert atmosphere is less than 10 vol. % of oxygen.

4. A process for depositing an oxide film on a metallic substrate by thermal plasma flash evaporation method, according to any of claims 1 to 3, wherein the step of depositing said ceramic intermediate layer is performed under a condition that a temperature of said metallic substrate is increased.

5. A process for depositing an oxide film on a metallic substrate by thermal plasma flash evaporation method according to claim 4, wherein an increase of said temperature of said metallic substrate is starts at 350° C.

* * * * *